United States Patent [19]

Kobayashi

[11] Patent Number: 5,342,213
[45] Date of Patent: Aug. 30, 1994

[54] IC SOCKET

[75] Inventor: Masahiko Kobayashi, Sagamihara, Japan

[73] Assignee: Minnesota Mining and Manufacturing Company, St. Paul, Minn.

[21] Appl. No.: 73,932

[22] Filed: Jun. 8, 1993

[30] Foreign Application Priority Data

Jun. 9, 1992 [JP] Japan .................. 4-149140

[51] Int. Cl.5 ............................. H01R 11/22
[52] U.S. Cl. .......................... 439/268; 439/259
[58] Field of Search ............... 439/259, 262, 263, 264, 439/266, 268, 269

[56] References Cited

U.S. PATENT DOCUMENTS

| | | | |
|---|---|---|---|
| 4,343,524 | 8/1982 | Bright et al. | 439/268 |
| 4,420,205 | 12/1983 | Kirkman | 439/266 |
| 4,468,072 | 8/1984 | Sadigh-Behzadi | 439/266 |
| 4,750,891 | 6/1988 | Egawa | 439/259 |
| 4,836,798 | 6/1989 | Carter | 439/268 |
| 5,059,135 | 10/1991 | Matsuoka et al. | 439/268 |

FOREIGN PATENT DOCUMENTS 2-28624  7/1990  Japan .

Primary Examiner—Khiem Nguyen
Attorney, Agent, or Firm—Gary L. Griswold; Walter N. Kirn; John C. Barnes

[57] ABSTRACT

An IC socket, capable of being applied to an IC device having short lead pins and ensuring reliable contact with the lead pins used, comprises contacts each having a first contact element that is substantially fixed and a second contact element that is elastically deformable, and an actuator for moving the second contact elements of the contacts. The second contact elements have their centers formed as engaging means for engaging with the actuator, and their portions near the surface of a socket body are formed as contacting means to be brought into contact with lead pins of an IC device. The second contact elements are located close to the first contact elements. When an IC device is inserted, the actuator separates the second contact elements from the first contact elements.

5 Claims, 6 Drawing Sheets

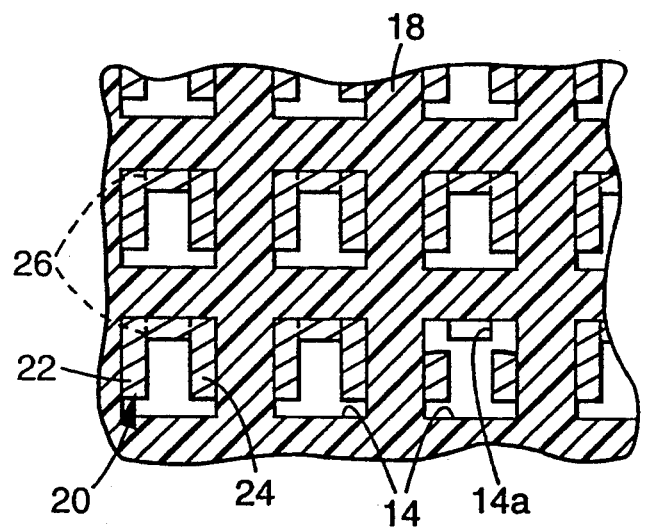
Fig. 4
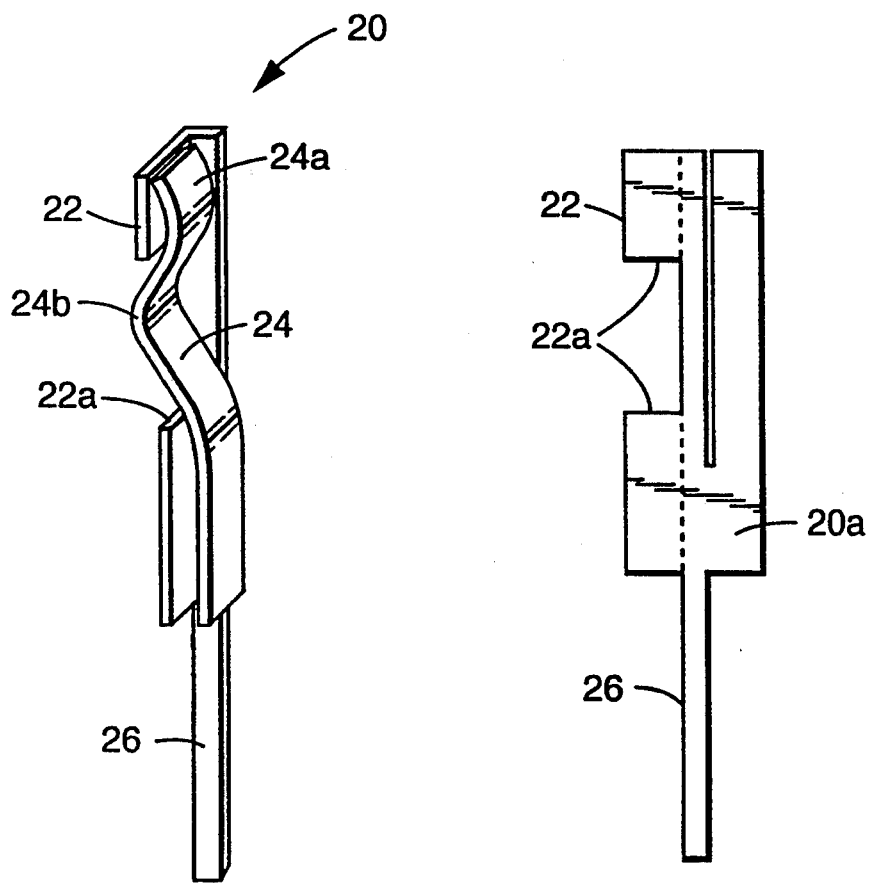
Fig. 5A  Fig. 5B

IC SOCKET

BACKGROUND OF THE INVENTION

1. Field of the Invention

The present invention relates to an IC socket of a zero insertion force (hereafter, ZIF) type.

2. Description of the Prior Art

There is an increasing demand for multi-functional and compact electronic equipment. In an effort to realize such electronic equipment, a surface mounting technique has been widely adopted, and pins of an IC device are arranged with smaller pitches or increasing in number, and IC devices are now designed to be more compact or have pins with smaller pitches, thereby resulting in shorter lead pins of an IC device. These lead pins are easily deformed and the compact sockets provide less contact area.

When a burn-in test or other test is performed on an IC device, a ZIF-type IC socket having contacts capable of opening and closing is employed so that no force will be applied to the lead pins of the IC device when the lead pins are inserted.

FIG. 8 shows an example of a conventional ZIF-type IC socket (disclosed, for example, in Japanese Utility Model Unexamined Publication No. 2-28624). The IC socket has holes 2 on the surface of a socket body 1. Lead pins of an IC device are inserted into the holes 2 as indicated with arrows. The holes 2 have contacts for receiving the lead pins. Each of the contacts is made up of a first contact element 3 that is fixed and a second contact element 4 that is elastically deformable. Lead pins are inserted between the first and second contact elements 3 and 4, and then locked.

An actuator 5 is installed to open or close the contacts. In the prior art shown in FIG. 8, the actuator 5 is formed with a movable plate arranged on the surface of the socket body 1, and has engaging means 6 that engage with the tops of the second contact elements 4. When lead pins are inserted, the actuator 5 is moved left. Then, the second contact elements 4 are moved left accordingly. Thereby, openings are created between the second contact elements 4 and the first contact elements 3. The lead pins are inserted smoothly without being subject to applied forces by the contacts. When the lead pins are inserted into the contacts, the actuator 5 is moved right. Then, the second contact members are moved right and reset to the original positions. Eventually, the lead pins are held between the first and second contact elements 3 and 4.

FIG. 9 shows another example of a conventional ZIF-type IC socket. The IC socket has holes 2 on the surface of a socket body 1. Lead pins of an IC device are inserted into the holes 2 as indicated with arrows. The holes 2 have contacts for receiving the lead pins. Each of the contacts includes a first contact element 3 that is fixed and a second contact element 4 that is elastically deformable. The lead pins are inserted and held between the first and second contact elements 3 and 4.

In the prior art shown in FIG. 9, an actuator 5 is formed with a movable plate arranged inside the socket body 1 having an engaging means 6 for pressing the second contact elements 4 towards the first contact elements 3. The actuator 5 is pressed leftward by a cam 7. When lead pins are inserted, the actuator 5 lies at a position as illustrated. Openings are created between the second contact elements 4 and the first contact elements 3. The lead pins are inserted smoothly without being subject to applied forces by the contacts. When the lead pins are inserted into the contacts, the cam 7 is rotated in the arrow direction to move the actuator 5 to the left. Then, the second contact elements 4 are moved towards the first contact elements 3. The lead pins are held between the first and second contact elements 3 and 4. In FIGS. 8 and 9, the first and second contact elements 3 and 4 are connected to a circuit board.

In the prior art shown in FIG. 8, an actuator 5 is arranged on the surface of a socket body 1 so that engaging means 6 will engage with the upper ends of second contact elements 4. This increases the depths from the surface of the actuator 5 to the contact points between the second contact elements 4 and the lead pins. Therefore, the IC socket of the prior art cannot apply to an IC device having shorter lead pins. In particular, IC devices to be mounted by surface mounting are usually required to be compact in design, and, therefore, have shorter pins. The IC socket of the prior art shown in FIG. 8 is unusable for these IC devices.

In the prior art shown in FIG. 9, the contact points between second contact elements 4 and lead pins can be positioned in the vicinity of the surface of a socket body 1. This IC socket can apply to an IC device having shorter lead pins. However, the contacts of the IC socket are the normal open type. After the lead pins are inserted, an actuator 5 must be moved to the left and held at a position so that the lead pins can be held between the first and second contact elements 3 and 4. In this way, electric continuity is ensured. The socket body 1 and actuator 5 are resin molded. This means that the socket body 1 and actuator 5 have been loaded. When heating in a burn-in test, the resin creeps to weaken the contact forces between the lead pins and the first and second contact elements 3 and 4.

The purpose of the present invention is to provide an IC socket having contacts capable of being applied to an IC device having short lead pins that are designed for high-density mounting and ensuring reliable contact with the lead pins during use thereof.

SUMMARY OF THE INVENTION

An IC socket according to the present invention comprises a socket body having holes arranged in a predetermined pattern on the surface; contacts made up of first contact elements that are substantially fixed, and second contact elements capable of deforming elastically are arranged in the holes and hold lead pins of an inserted IC device, and an actuator for moving the second contact elements of the contacts. The second contact elements have an engaging means for engaging with the actuator in the center thereof and a contacting means to be brought into contact with the lead pins of an IC device in their portions near the surface of the socket body beyond the centers. The second contact elements are closely arranged to the first contact elements. When an IC device is inserted, the actuator separates the second contact elements from the first contact elements.

In the present invention, the second contact elements and the actuator are opposed to the first contact elements. The first contact elements may have cavities at the positions facing the second contact elements. The first and second contact elements may engage with each other through the cavities. Therefore, the second contact elements may have projections facing the cavities of the first contact elements; thus helping the actuator permit smooth movement of the second contact elements. Alternatively, projections for offering contact with the lead pins of an IC device may be formed at the ends, substantially, of the first contact elements to provide sufficient contact forces.

In the foregoing configuration, second contact elements are shaped to have contacting means that are brought into contact with the lead pins of an IC device in their portions near the surface of a socket body beyond their centers. This helps to minimize the distances between the surface of the socket body and the contact points between the second contact elements and the lead pins. Therefore, the IC socket having said configuration can be applied to an IC device having short lead pins. When an actuator is moved to the right, openings to which lead pins are inserted are created between first contact elements and second contact elements. After the lead pins are inserted, when the actuator is moved to the left, the lead pins are held between the first contact elements and second contact elements. At this time, the lead pins are reliably held owing to the elasticity of the second contact elements.

BRIEF DESCRIPTION OF THE DRAWING

FIG. 4 is a horizontal sectional view, taken along line IV—IV of FIG. 1.

FIG. 5A is a perspective view showing one of the contacts of FIG. 1, and FIG. 5B is a plan view of an unprocessed plate.

DETAILED DESCRIPTION OF THE PRESENTLY PREFERRED EMBODIMENTS

Figure 1:
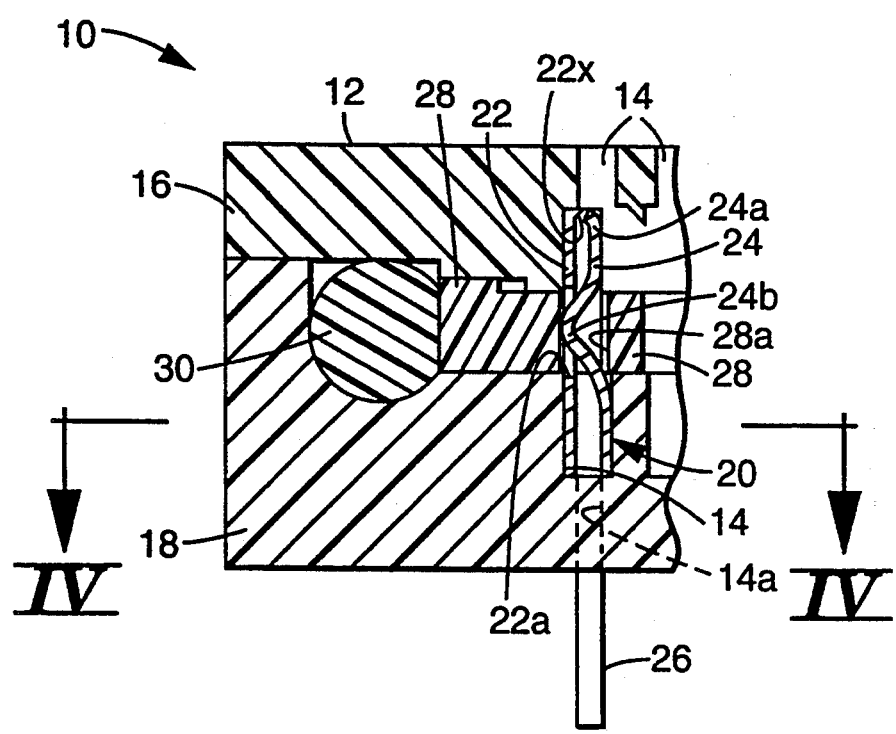
FIG. 1 is a cross-sectional view showing the first embodiment of the present invention.
Figure 2:
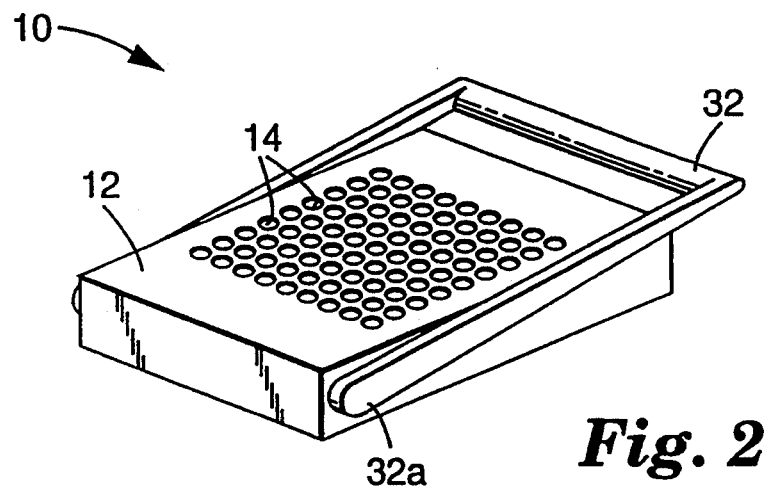
FIG. 2 is a perspective view of the IC socket shown in FIG. 1.

FIG. 1 is a cross-sectional diagram of an IC socket of the first embodiment of the present invention. FIG. 2 is an oblique view of the IC socket.

An IC socket has an almost rectangular socket body 10. The socket body 10 has holes 14 into which lead pins of an IC device are inserted. The holes 14 into which lead pins are inserted are arranged according to the arrangement of the lead pins of an IC device; such as, a pin grid array spaced at intervals of 2.54 mm or 1.27 mm, or a zigzag array of the pin grid array. In this embodiment, the socket body 10 is made up of a top plate 16 and a base plate 18. The holes 14 penetrate the top plate 16. The base plate 18 has holes arranged similar to the holes 14 that are extensions of the holes 14.

The holes 14 of the socket body 10 have contacts 20. As shown in FIG. 1 or 5, each of the contacts 20 includes a first contact element 22 that is substantially fixed and a second contact element 24 that is elastically deformable. The contact 20 is a metallic leaf made by bending a metal fragment 20a according to the dashed lines in FIG. 5B. The first contact element 22 and second contact element 24 have centers aligned with the sides of a terminal 26 extending vertically and are opposing each other. The terminal 26 extends downward beyond the first and second contact elements 22 and 24. The holes 14 have a two-stepped shape in the base plate 18. The lower portions 14a of the holes 14 have the same cross section as the terminal 26. Therefore, when the terminals 26 are fitted into the lower portions of the holes 14a, the contacts 20 are locked in the base plate 18. As shown in FIG. 4, the lower portions of the first and second contact elements 22 and 24 are resting against the side walls of the holes 14 in the base plate 18.

As shown in FIG. 1, the upper portions of the first contact elements 22 are resting against the side walls of holes 14 in a top plate 16 and are united with the upper portions of the terminals 26. Therefore, the first contact elements 22 are substantially fixed to a socket body 10. The first contact elements 22 have cavities 22a in the centers thereof. Second contact elements 24 opposed to the first contact elements 22 are formed as single members continuing from top to bottom.

As shown in FIGS. 1 and 5, only the lower portions of the second contact elements 24 are united with terminals 26. The remaining major portions are not fixed to any members but are elastically deformable. The lower portions of second contact elements 24 are, as described above, fixed, and their upper portions serve as contacting means 24a that are brought into contact with lead pins of an IC device. The centers of the second contact elements 24 serve as engaging means 24b for engaging with an actuator, to be described later. The contacting means 24a are located on the side of the surface 12 of a socket body 10 beyond the engaging means 24b. Each of the second contact elements 24 is curved like a wave when viewed laterally. The engaging means 24b corresponds to the curved portions. The engaging means 24b is opposed to cavities formed in the centers of the first contact elements 22. The contacting means 24b is curved opposite to the engaging means 24b. The tips of the contacting means 24a are brought into contact with lead pins of an IC device. Tiny projections 22x are formed at or in the vicinity of the tips of the first contact elements 22, and brought into contact with lead pins of an IC device.

As shown in FIG. 1, an actuator 28 is formed between a top plate 16 and a base plate 18. The actuator 28 is a sliding plate having the same holes 28a as holes 14 of a socket body 10. Contacts 20 are inserted into the holes 28a of the actuator 28. The side walls of the holes 28a pass through cavities 22a formed in the centers of the first contact elements 22 and engage with the engaging means 24b of the second contact elements 24.

A cam 30 is arranged at an end of the actuator 28. On both sides of a socket body 10, a manipulation lever 32 is fixed with pivots 32a as shown in FIG. 2. The cam 30 is coupled to the manipulation lever 32 at the pivots 32a. When the manipulation lever 32 is turned, the cam 30 rotates simultaneously. In this embodiment, the cam has an arc section and a plane section. The plane section of the cam 30 is usually in contact with the end surface of the actuator 28.

Second contact elements 24 capable of being deformed elastically may be arranged close to the first contact elements 22, and the second contact elements 24 may be arranged to be in close contact with the first contact elements 22 with loads applied preliminarily in a direction of departure from the first contact elements 22. That is to say, in FIG. 1, contacting means 24a of the second contact elements 24 is pressed elastically against the first contact elements 22. Then, when an actuator 28 lies at a position shown in FIG. 1, the second contact elements 24 are brought into close contact with the first contact elements 22. In this state, lead pins of an IC device cannot be inserted.

Figure 3:
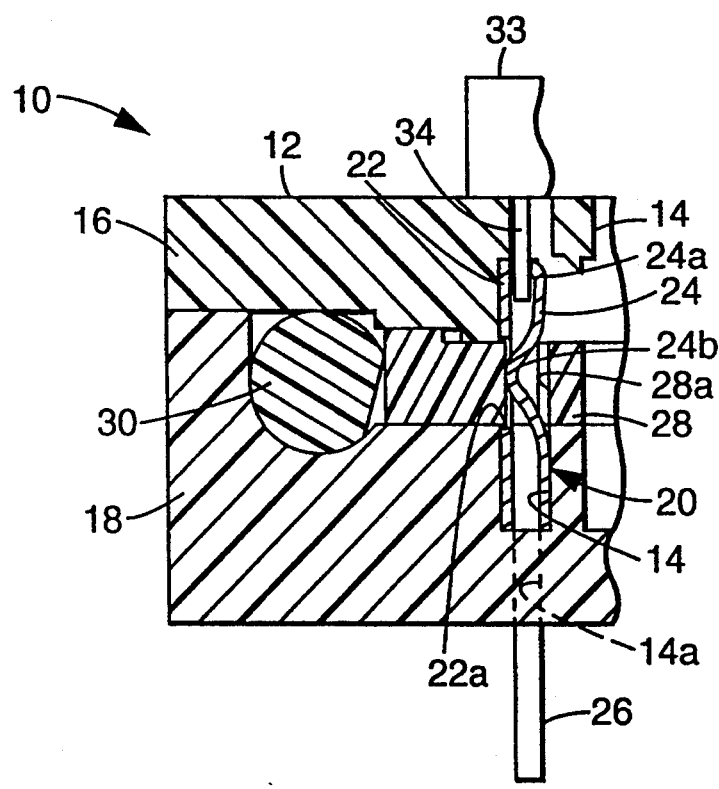
FIG. 3 is a cross-sectional view showing a state in which the lead pins of FIG. 1 are inserted.

When lead pins of an IC device are inserted, a manipulation lever 32 is manipulated to rotate a cam 30. Thus, the plane section of the cam 30 is tilted with respect to the end surface of an actuator 28. Thereby, the actuator 28 moves to the right in FIG. 1 to push the engaging means 24b of the second contact elements 24, thereby causing the second contact elements 24 to depart from the first contact elements 22. Eventually, openings are created between the contacting means 24a of the second contact elements 24 and the first contact elements 22. Then, the lead pins of the IC device can be inserted into contacts 20 through holes 14 of a socket body 10. After the lead pins of the IC device are inserted, the manipulation lever 32 is manipulated to reverse the cam 30. This brings the plane section of the cam 30 into contact with the end surface of the actuator 28. Then, the second contact elements 24 attempt to return to the initial positions, at which the second contact elements 24 are in close contact with the first contact elements 22. The lead pins are held between the first and second contact elements 22 and 24. The lead pins are reliably held because of the elasticity of the second contact elements 24. FIG. 3 shows a state in which lead pins 34 of an IC device 33 are inserted into contacts 20 as described above.

Figure 6:
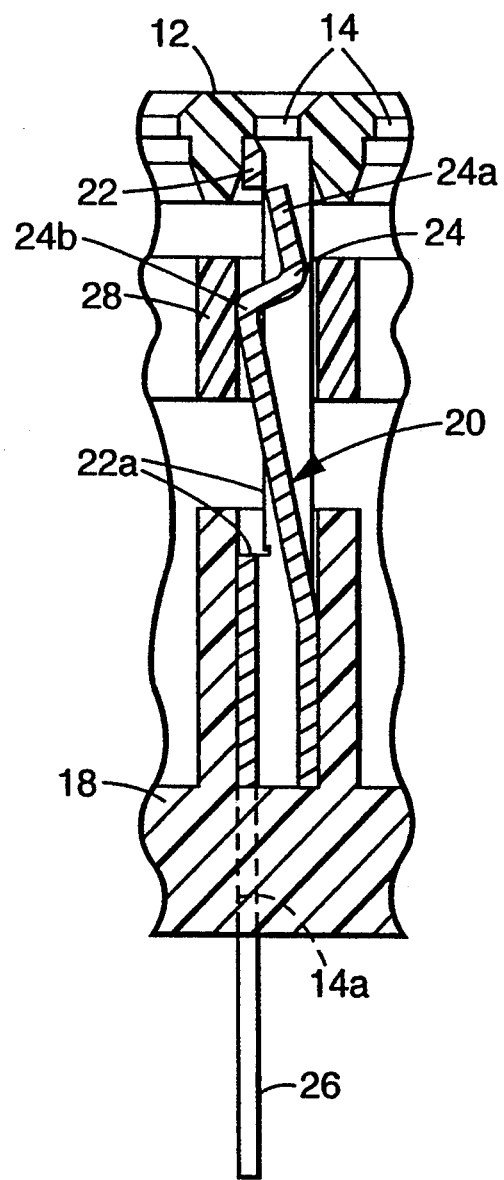
FIG. 6 is a cross-sectional view showing the second embodiment of the present invention.
Figure 7:
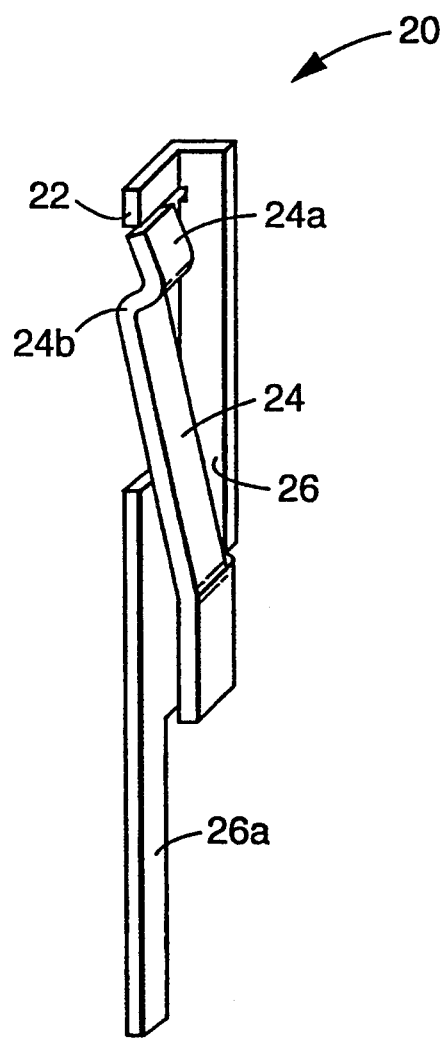
FIG. 7 is a perspective view of the contacts of FIG. 6.
Figure 8:
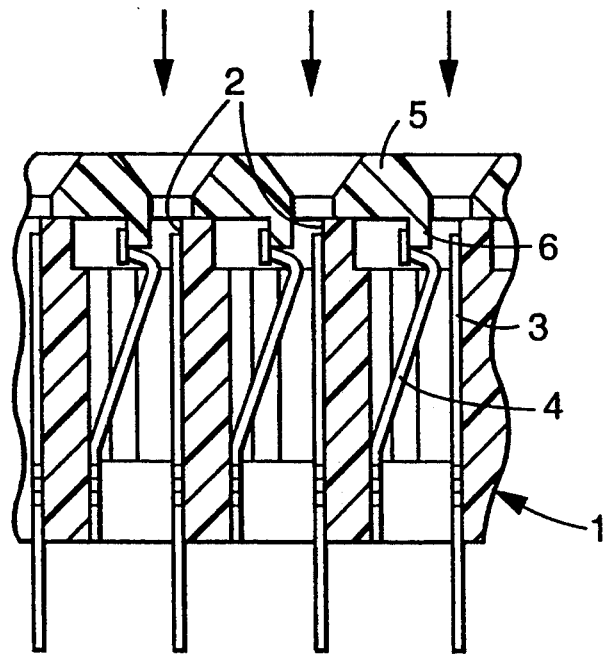
FIG. 8 shows an example of a prior art.
Figure 9:
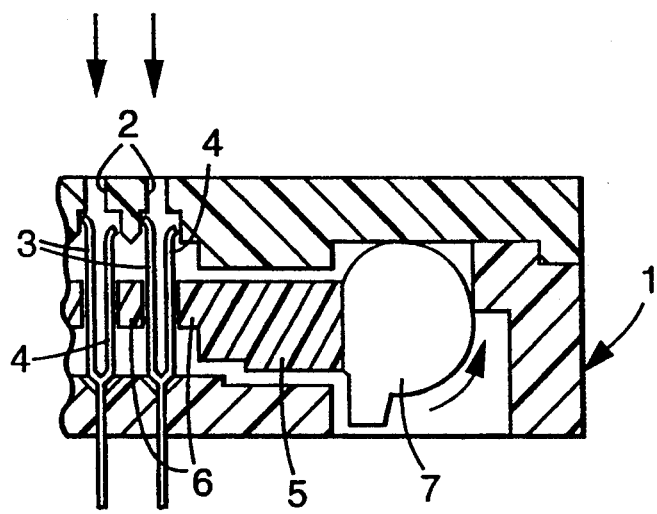
FIG. 9 shows another example of a prior art.

FIG. 6 is a cross-sectional diagram of an IC socket of the second embodiment of the present invention. FIG. 7 is an oblique view of the IC socket.

The outline configuration of the IC socket is identical to that of the previous embodiment. Corresponding members are assigned the same reference numerals. A detailed description will be omitted.

Contacts 20 in this embodiment are structured differently from those in the previous embodiment. Each of the contacts 20 is made up of a first contact element 22 that is substantially fixed and a second contact element 24 capable of being deformed elastically. The contacts 20 are metallic leaves made by bending metal plates. The first contact element 22 and the second contact element 24 have their centers aligned with the sides of a terminal 26 extending vertically and are opposing each other. Lower extensions 26a of the terminals 26 are extending downward beyond the first contact elements 22. The lower extensions 26a are fitted and locked into holes in a base plate 18.

The second contact elements 24, which are capable of being deformed elastically, have, similar to those in the previous embodiment, the lower portions fixed. The upper portions of the second contact elements 24 serve as contacting means 24a, and the centers are curved to form engaging means 24b.

The first contact elements 22 and the second contact elements 24 are substantially opposed. The upper margins of the contacting means 24a of the second contact elements 24 are located at almost the same height as the lower margins (upper margins of cavities 22a) of the first contact elements 22. Therefore, as shown in FIG. 7, the second contact elements 24 are located below the first contact elements 22 (within the cavities 22a) with no load applied. When contacts 20 are assembled as shown in FIG. 6, an actuator 28 lies at a position shown in FIG. 6 and initial loads are applied to second contact elements 24. The surfaces of the contacting means 24a of the second contact elements 24, which are facing first contact elements 22, lie on the same plane as the opposing surfaces of the first contact elements 22. Thus, the second contact elements 24 are brought into close contact with the first contact elements with loads applied in a direction of departure from the first contact elements 22. Then, when the actuator 28 lies at a position shown in FIG. 6, the second contact elements 24 are applied initial loads, thereby improving the response characteristic of the second contact elements 24 with respect to the action of the actuator 28. When the second contact elements 24 are free from initial loads, before the second contact elements 24 start moving in which they are elastically pressing the first contact elements 22, the actuator 28 must be moved a long distance to provide sufficient contact forces. In this embodiment, despite a short moving distance, sufficient contact forces are induced.

As previously described, according to the present invention, the distances between the IC receiving surface of a socket body and the contact points between the second contact element and lead pins can be reduced. Therefore, an IC socket of the present invention can be applied to an IC device that has short lead pins for high-density mounting. Furthermore, lead pins are reliably held between the first contact elements and second contact elements.

I claim:

1. An IC socket comprising a socket body having a surface and a plurality of holes arranged on said surface at a predetermined pattern, a contact arranged in each of the holes and comprising a first substantially fixed contact element and a second elastically deformable contact element for holding therebetween a lead pin of an IC device, and an actuator for moving the second contact element of said contact, wherein said second contact element comprises at an intermediate point thereof, an engaging means for engaging with said actuator, and a contacting means at a position on the side of said second contact element spaced from said intermediate point for contacting a lead pin of an IC device, and wherein said second contact element is arranged close to said first contact element and said actuator causes said second contact element to be spaced at one end from said first contact element when the IC device is inserted in the IC socket, and wherein said first and second contact elements comprise oppositely disposed metal elements; said second contact element and said actuator being located on opposite sides of said first contact element; said first contact element having a cavity at a position facing the second contact element; said second contact element and said actuator being able to engage with each other via the cavity of said first contact element.

2. An IC socket according to claim 1, wherein said second contact element comprises a projection at said intermediate point bent so that it projects past the first contact element, and said actuator is engagable with said projection of said second contact element.

3. An IC socket according to claim 1, wherein said second contact element comprises a projection bent so that it projects into the cavity of the first contact element, and said actuator engages said projection of said second contact element.

4. An IC socket according to claim 1, wherein said first contact element has at said one end thereof, a projection for making contact with a lead pin of an IC device.

5. An IC socket according to claim 2, wherein said first contact element has at said one end thereof, a projection for making contact with a lead pin of an IC device.

* * * * *